United States Patent [19]
Piper et al.

[11] Patent Number: 5,831,504
[45] Date of Patent: *Nov. 3, 1998

[54] ACTUATOR ASSEMBLY

[75] Inventors: John G. Piper, Midvale; Michael J. Bettinger, Boise, both of Id.

[73] Assignee: Micron Technology, Inc., Boise, Id.

[ * ] Notice: The term of this patent shall not extend beyond the expiration date of Pat. No. 5,644,279.

[21] Appl. No.: 847,774

[22] Filed: Apr. 23, 1997

Related U.S. Application Data

[63] Continuation of Ser. No. 626,982, Apr. 3, 1996, Pat. No. 5,644,279.

[51] Int. Cl.⁶ .............................. H01F 7/08; G05B 19/04
[52] U.S. Cl. ...................... 335/228; 318/568.21; 335/229
[58] Field of Search .................................... 335/228, 229; 318/568.21, 566; 227/19, 179.1

[56] References Cited

U.S. PATENT DOCUMENTS

| | | |
|---|---|---|
| 2,690,529 | 9/1954 | Linblad . |
| 3,675,166 | 7/1972 | McCloskey et al. . |
| 3,848,216 | 11/1974 | Gamble . |
| 4,470,030 | 9/1984 | Myers . |
| 5,270,625 | 12/1993 | Neff . |
| 5,285,946 | 2/1994 | Tomigashi et al. . |
| 5,422,554 | 6/1995 | Rohde . |
| 5,434,549 | 7/1995 | Hirabayashi et al. ................... 335/229 |
| 5,497,135 | 3/1996 | Wisskirchen et al. ................... 335/229 |
| 5,546,063 | 8/1996 | Hoffman .................................. 335/229 |
| 5,644,279 | 7/1997 | Piper et al. .............................. 335/228 |

*Primary Examiner*—Stuart N. Hecker
*Attorney, Agent, or Firm*—Kirkpatrick & Lockhart LLP

[57] ABSTRACT

A magnetic actuator design and method of use is provided that generally reduces problems associated with conventional actuators and can be specifically employed to increase the accuracy of actuator type precision operations, such as surface mounted electrical component placement, die and attach tooling movements, and tape and reel part storage tooling. The actuator includes a housing, a stem slidably disposed and having a rest position within the housing, a first magnetic portion attached to the stem and, a second magnetic portion attached to the housing, the second magnetic portion being of sufficient strength and oriented to exert a generally predetermined force on said first magnetic portion sufficient to resist displacement of said stem from said rest position. In a preferred embodiment for use in the head of a pick and place machine, the stem is a nozzle through which a vacuum can be drawn, and the first and second magnetic portions are rare earth magnets that are oriented so as to produce an attractive force between the magnets. The first magnet is attached to a stem holder, which is seated on the housing in the rest position and is used to prevent rotation of the stem about a longitudinal axis.

24 Claims, 3 Drawing Sheets

ACTUATOR ASSEMBLY

This is a continuation of application Ser. No. 08/626,982 filed on Apr. 3, 1996, now U.S. Pat. No. 5,644,279.

BACKGROUND OF THE INVENTION

1. Field of the Invention

The present invention relates generally to an improved actuator design for applying a varying force on an actuator stem during actuation. More particularly, the present invention relates to an improved actuator design incorporating a magnetic actuating force for use in machines, such as surface mount placement equipment, die and attach equipment, tape and reel production equipment and the like.

2. Description of the Invention Background

Solid state electrical devices are typically produced by attaching a plurality of miniaturized electrical components to a common substrate, such as a printed circuit board. The proper performance of the device is dependent upon the precise placement of each electrical component on the substrate. Recent advances in the miniaturization of electronics have brought about the need for component placement capabilities with accuracies within a few hundred microns. The difficulty in placing electrical components to that level of precision limits the achievable miniaturization of the device, which is directly related to the operational speed of the device, and the variability in the performance characteristics of the device.

The placement of electrical components is commonly performed using a pick and place machine to surface mount the electrical components on the substrate. Pick and place machines typically employ a number of movable heads each having a nozzle through which a vacuum or suction is applied to pick a component off a continuous feed assembly, such as a tape and reel assembly. A computer in the pick and place machine is used to control the movement of the head and the machine precisely places the component on the substrate and the vacuum or suction is then released.

The distance travelled by the head during the picking and placing operations is controlled either electronically or is set to a predetermined distance. In electronically controlled heads, the head is driven by a specially dedicated motor and the precise distance between the head and the location where the component is to be picked up or placed is encoded into the computer and the movement of the head is precisely incremented to perform the pick and place operation. In pick operations using a spring actuated head, the computer aligns and lowers the head to a preset level without taking into account the size of the component. When the nozzle contacts the component prior to reaching the preset level, continued lowering of the nozzle, known as overstroke, compresses the spring so as to avoid crushing the component or damaging the nozzle. The force exerted by the spring also ensures good contact between the nozzle and the component so that a sufficient vacuum or suction can be applied to lift the component off the assembly. Once the preset level is reached, the machine then lifts the head and the component off the feed assembly. The placement of the component using the spring actuated head occurs in an analogous fashion.

A problem with spring actuated heads is that, after contact is made between the nozzle and the component, there is a period of time and overstroke required to compress the spring and build a sufficient force to produce good contact for applying the vacuum. Another problem is that the continued application of force during any overstroke of the head can damage the component. The potential for damage to a component is an increasing concern with electronically controlled heads as the heads must brought into more firm contact with the larger components to enable a sufficiently strong vacuum to be formed to pick up the larger components. The precision required in the electronic head does not provide a large tolerance for variations in component sizes unless a sensor feedback system is employed that will tend to further slow down the pick and place process.

In addition, while spring actuated heads provide control over the placement of small articles, such as those less than 10 mm×10 mm, comparable to the electronically controlled heads, the precision of the spring actuated heads diminishes when used with larger articles. We have found that when the spring actuated heads are used to place larger components (i.e. greater than 10 mm×10 mm), the compressive and expansive forces exerted by the components on the spring are transferred as helical forces on the attached nozzle. The helical forces generated by the spring skews the orientation of the nozzle such that larger components can not be placed using spring actuated heads with the same precision achievable with smaller components. The inability to precisely place larger components with the spring actuated heads has resulted in a dramatic reduction in the overall capacity of pick and place machines because only the electronically controlled heads can be used to reliably place large components, such as 20-lead small outline dual in packages. An additional problem with spring actuators is the need for spring hangers in the heads, which can cause additional maintenance problems and increased machine downtime.

Advances in semiconductor technology have resulted in the development of larger, and more costly components to be used in electrical devices and, as such, have placed increasing demands on the capabilities of manufacturers to produce large component devices in a cost effective manner. The primary options that manufacturers have to increase their capacity are to upgrade their present equipment to replace all of the spring actuated pick and place heads with electronically controlled heads or to purchase new pick and place equipment which consist entirely of electronically controlled heads. Either of these options represent significant expenditures and possibly a significant loss due to the premature retiring of existing machinery, both of which will greatly increase the overall production cost of the devices and will do little to increase the yield by reducing the extent of damage to the components during pick and place operations. Many of the pick and place machines employing spring actuators are currently used by industry to place larger components; however, the full capacities of the machines cannot be exploited due to the problems with the spring actuated heads. Also, various die and attach equipment and tape and reel production machines suffer the same problems with spring actuated placement heads. As such, there is great need to increase the speed and performance of machines for the placement of components.

The present invention is directed to an improved actuator design which overcomes, among others, the above-discussed problems so as to allow machines to more quickly and accurately place components.

SUMMARY OF THE INVENTION

The above objects and others are accomplished by an actuator design in accordance with the present invention. The actuator includes a housing, a stem slidably supported by and having a rest position relative to the housing, a first magnetic portion attached to the stem, and, a second magnetic portion attached to the housing, the second magnetic portion being of sufficient strength and oriented to exert a generally predetermined force on the first magnetic portion to resist displacement of the stem from the rest position. In a preferred embodiment for use in the head of a pick and place machine, the stem is a nozzle through which a vacuum can be drawn, and the first and second magnetic portions are rare earth magnets that are aligned so as to produce an attractive force between the magnets. The first magnet is attached to a stem holder, which is used to prevent rotation of the stem about a longitudinal axis and is seated on the housing in the rest position.

In the use of the present invention, the application of an external load, such as that exerted by a component when contacted by a pick and place nozzle, will immediately produce a force on the component allowing sufficient vacuum to be formed, because the first and second magnets will resist movement from the rest position until a sufficient predetermined force has been exerted on the nozzle to overcome the magnetic force. Once sufficient force has been applied to overcome the magnetic force, the nozzle will actuate and the force applied to the component will immediately decrease and equilibrate with the external applied load. In this way, the maximum contact force that is applied to a component can be set to a known constant value by the selection and a spacing of the first and second magnets in the rest position.

Accordingly, the present invention provides cost effective means to generally reduce problems with actuators and specifically to increase the overall capacity of pick and place machine. These and other details, objects, and advantages of the invention will become apparent as the following detailed description of the present preferred embodiment thereof proceeds.

BRIEF DESCRIPTION OF THE DRAWINGS

The preferred embodiment of the present invention will be described in greater detail with reference to the accompanying drawings, wherein like members bear like reference numerals and wherein.

DETAILED DESCRIPTION OF THE PREFERRED EMBODIMENTS

Figure 1:
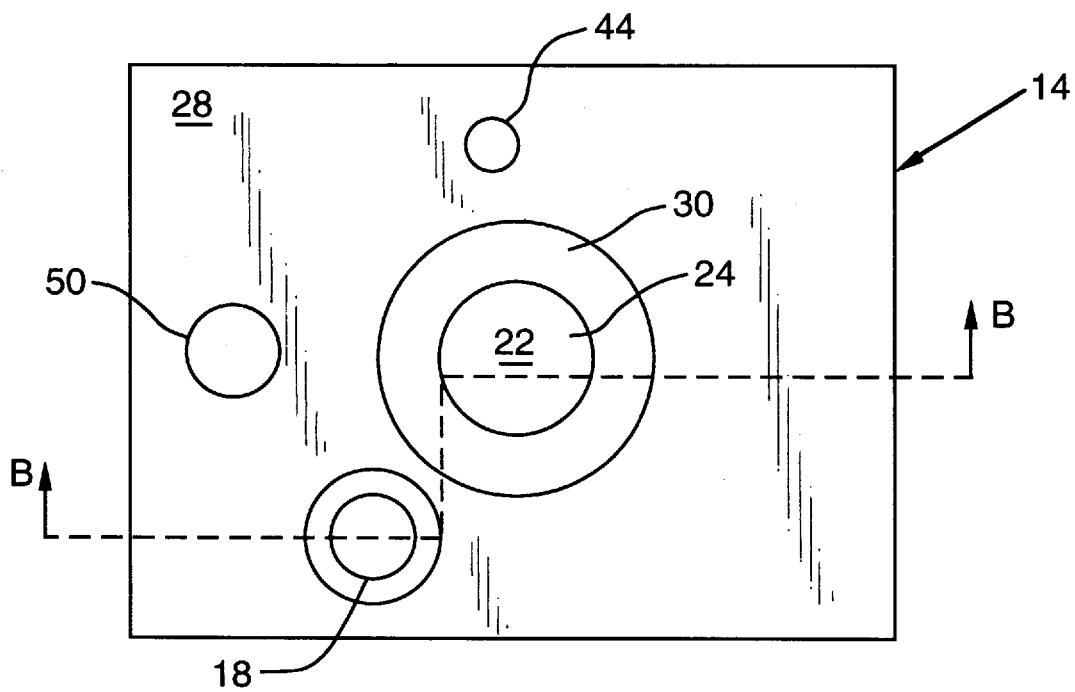
FIG. 1 is a top view of the housing showing view line B—B.
Figure 2:
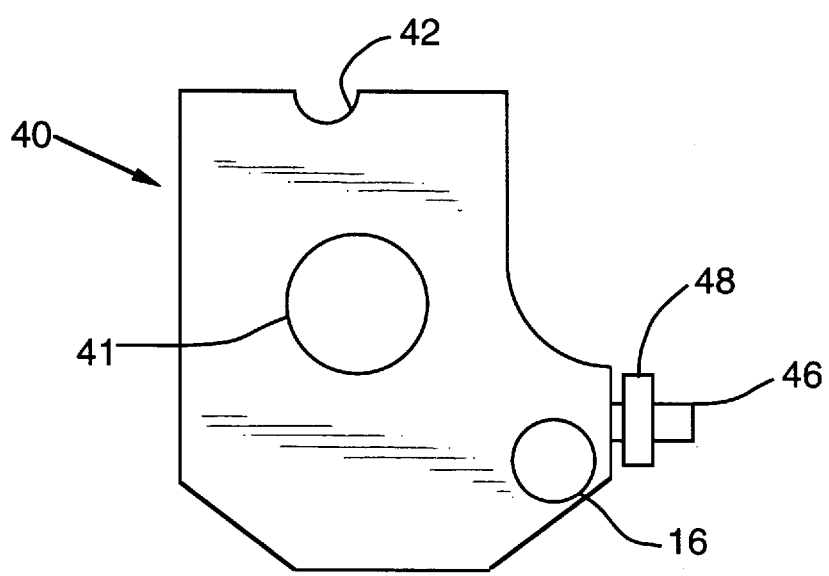
FIG. 2 is a bottom view of the stem holder.

The improved actuator apparatus 10 will be described generally with reference to the drawings and the use of the apparatus 10 in an article manipulation apparatus, such as a pick and place machine, for the purpose of illustrating present preferred embodiments of the invention only and not for purposes of limiting the same. In accordance with the present invention, an actuator stem 12 is actuated within a housing 14 relative to a rest position by a magnetic force exerted between a first magnetic portion 16 attached to the stem 12 and a second magnetic portion 18 attached to the housing 14. The rest position is the position in which the actuator stem 12 rests when no external load is applied to the stem 12.

Preferably, the housing 14 includes first and second openings, 20 and 22, respectively defined by a cylindrical bore 24 through first and second surfaces, 26 and 28, respectively, in housing 14. The housing 14 is preferably constructed of anodized aluminum; however, any suitably resilient material would be appropriate for the housing 14. A tubular bearing 30 is disposed in the cylindrical bore 24 having an inner dimensions suitable to provide for reciprocal movement of the stem 12 within the bearing 30. The bearing 30 is preferably constructed from a low alloy steel or a material having similar mechanical durability and wear characteristics. In a preferred embodiment for a pick and place machine, the housing 14 is sized to replace the existing actuator assembly, such as a spring actuator assembly.

Figure 3:
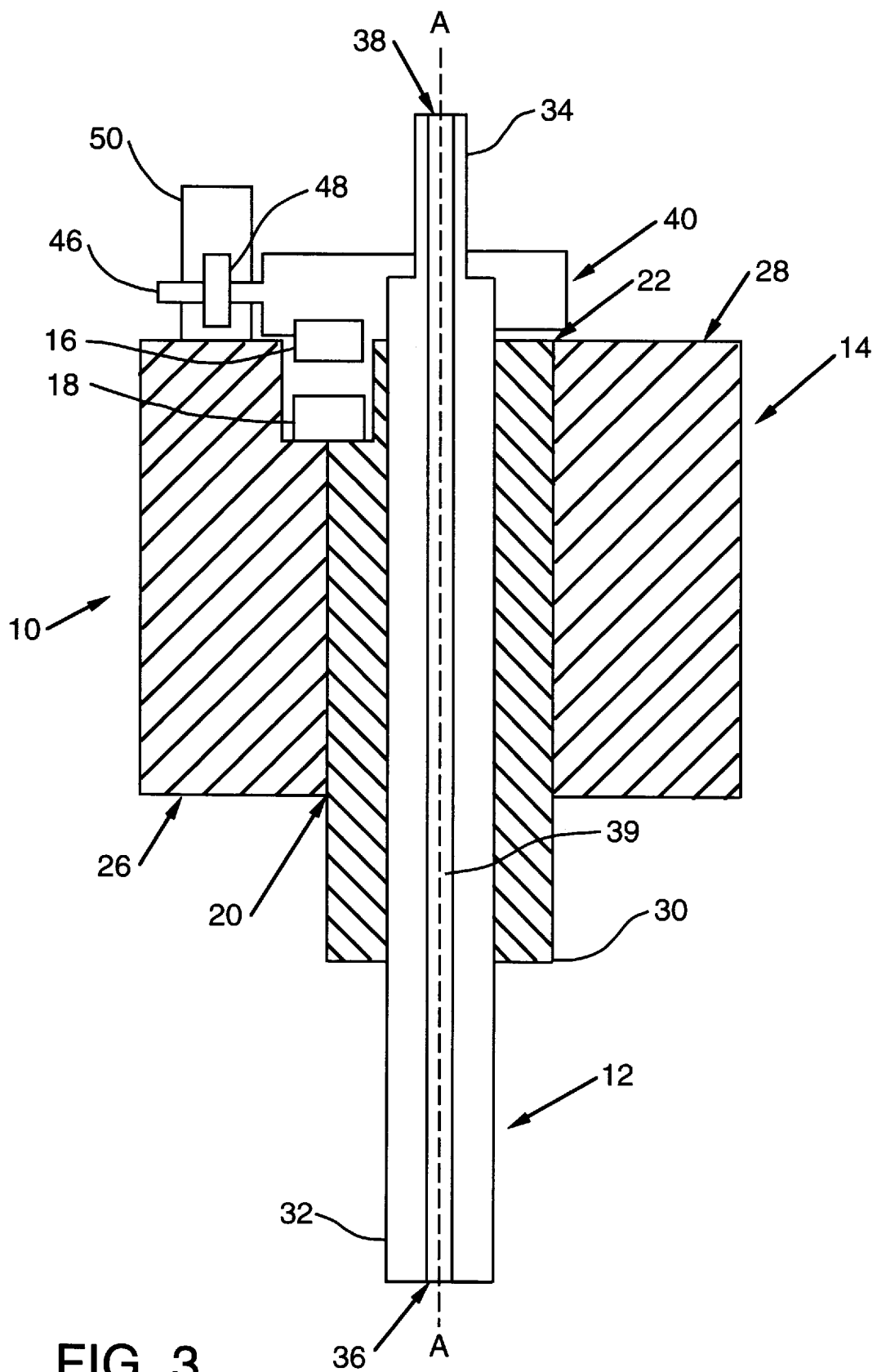
FIG. 3 is a side view of the apparatus along the line B—B.
Figure 4:
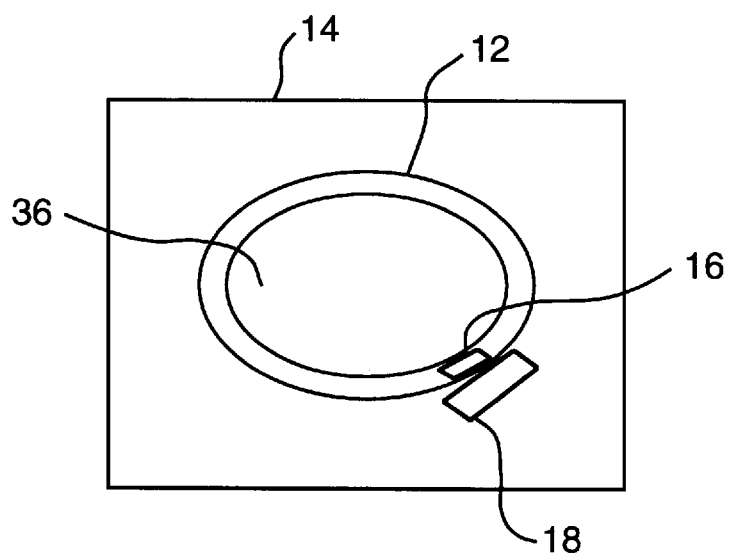
FIG. 4 is a top view of an embodiment of the present invention.

In a preferred embodiment, the stem 12 is an elongated cylindrical member having a longitudinal axis A—A between first and second ends, 32 and 34, respectively. The stem 12 has a circular cross section perpendicular to axis A—A that is sized to allow the stem 12 to slide within the bearing 30 and the first and second ends, 32 and 34, respectively, extend out of the housing 14 through the first and second openings, 20 and 22, respectively. In a current application of the apparatus 10, shown in FIG. 3, for use in pick and place machines, the stem 12 forms a nozzle through which a vacuum is drawn to pick up components during the manufacturing of semiconductor components. The first and second ends, 32 and 34, respectively of nozzle 12 contain first and second apertures, 36 and 38, respectively, connected by a longitudinal bore 39 providing fluid communication in the nozzle 12. It is also preferred that the nozzle 12 be provided with a necked down portion near the first end 32 to allow the nozzle 12 to preferentially fracture at the necked down portion in case of an accidental overload. The nozzle is preferably constructed from a low alloy steel or a material having similar mechanical durability and wear characteristics.

In a preferred embodiment, the second end 34 of the stem 12 passes through and is attached to a stem holder 40 by conventional means, such as by screws in a recessed portion 41 of the stem holder 40. The stem holder 40 is seated upon the second surface 28 in the rest position and has a cross sectional area that is less than that of the second surface 28 to allow the stem holder 40 to be placed inside an existing placement head along with the housing 14. The stem holder 40 further contains a guide bore 42 that is substantially parallel to the axis A—A and cooperates with a stem guide 44 that is attached to the second surface 28 of the housing 14 to prevent rotation of the stem 12 around the axis A—A, (i.e. the theta direction), which is sometimes referred to as providing "theta control". Additional theta control is preferably provided using a theta shaft 46 attached to the stem holder 40 and that extends substantially perpendicular to the axis A—A. A rotating circular theta bearing 48 is attached to the theta shaft 46. A theta guide 50 is attached to the second surface 28 of the housing 14 substantially parallel to the axis A—A and aligned so as to cooperate with the theta bearing 48 to prevent rotation of the stem 12 around the axis A—A in the clockwise direction. Those skilled in the art will appreciate that the stem guide and theta controls can be configured in any manner to achieve the objective of preventing rotation of the stem, or eliminated in the alternative embodiment as discussed further below.

In a preferred embodiment, the first magnetic portion 16 is attached to the stem holder 40 and aligned with the second magnetic portion 18, which is recessed in the second surface 28 of the housing 14 so that an attractive force is exerted between the two magnetic portions. In a preferred embodiment, the first and second magnetic portions, 16 and 18, respectively, are rare earth magnets, such as neodymium.

Alternatively, iron compounds can be substituted for one of the magnetic portions or other magnetic materials, such as alincore, can be used within the scope of the invention. The second magnetic portion 18 is preferably offset slightly in the clockwise direction with respect to the axis A—A so that the rotational force resulting from the offset of the first magnetic portion 16 will press the theta bearing 48 against the theta guide 42 to prevent rotation of the stem 12 during operation.

In an alternative embodiment, the first magnetic portion 16 can be integral with the stem 12. For example, the first magnetic portion 16 can be a portion of the stem 12, such as a band of magnetic material in a primarily nonmagnetic stem and the second magnetic portion 18 can be positioned within the housing 14 nearer the stem 12 or in the bearing 30, if present, so that the desired magnetic force is produced. In addition, if an integral first magnetic portion 16 is incorporated, the stem holder 40 can be eliminated from the design and theta control can be achieved by other means, such as by designing the stem 12 to have a portion of the cross section perpendicular to the axis A—A having a noncircular cross section and an internal surface of the housing 14 or bearing 30, if present, that conforms to the cross section so as to prevent rotation of the stem 12.

The present invention can be used alternatively with the first and second magnetic portions, 16 and 18, respectively, being aligned with like poles facing each other, thereby establishing a repulsive force between the magnetic portions. In that case, the rest position of the actuator would be at a point of separation where the repulsive force was zero. If an external load was applied to actuate the stem 12 and the first magnetic portion 16 toward the second magnetic portion 18, an increasing repulsive force would result tending to restrain additional movement of the stem 12 toward the second magnetic portion 18 and to move stem 12 and first magnetic portion 16 away when the external load was removed. It can be appreciated that additional magnetic portions in various alignments may be employed within the present invention by those skilled in the art to produce a desired resistance pattern for a particular application.

An example of the utility of the present invention will be described with respect to the use of the apparatus 10 as a replacement for a spring actuator in a pick and place machine to produce a magnetic bondhead. The nozzle 12 is a standard 4 mm diameter nozzle with a 1 mm longitudinal bore for use in a head with a total actuation range of approximately 7 mm. within the head. The rare earth magnets, 16 and 18, respectively, used in the magnetic bondhead are cylindrically shaped 0.125 inches in diameter and 0.125 inches high and are mounted in the stem holder 40 and the housing 14, respectively, approximately 40 mils in the rest position so as to require at least 100 grams of force to separate the magnets, 16 and 18, respectively. In the method of operation, the apparatus 10 is mounted in a head of the pick and place machine and a vacuum line is attached to the second aperture 38 in the second end 34 of nozzle 12. The apparatus 10 is lowered toward a feed line of components, such as individual semiconductor components, or dies, on a continuous tape. The apparatus is lowered a predetermined distance and a vacuum is drawn through the nozzle 12. Once the nozzle contacts the component, continued lowering of the head immediately exerts a force on the component through the nozzle, because the attractive force between magnets 16 and 18, respectively, resists displacement of the nozzle from the rest position. The force exerted on the component will continue to increase with the continued lowering of the head until the component exerts sufficient force on the nozzle 12 to overcome the attractive forces between the magnets, 16 and 18 respectively, at which time the stem 12 will actuate separating the magnets. The actuation of the nozzle 12 will immediately result in a decrease in the force exerted upon the components by the nozzle 12, thereby preventing damage to the component due to overstroke. After the head has been lowered to its predetermined level, the head will then be raised removing the external load placed on the nozzle 12 via the component and the attractive force between the magnets, 16 and 18, will cause the stem 12 to return to the rest position.

Those of ordinary skill in the art will appreciate that the present invention provides advantages over the current state of the art for producing electrical devices. In particular, the present invention provides a way to increase the machine capacity by shortening the time to pick up a component and by lessening the possibility of damage to the component due to overstroking of the pick and place head of existing pick and place machines for placing larger electrical components on electrical device substrates. Also, the present invention allows for more precise placement of components that can result in additional performance gains, such as increased operation times and reduced variability, in the electrical devices produced using the present invention. Thus, the present invention provides a cost effective solution to the production capacity limitations encountered with the use of prior art actuators. While the subject invention provides these and other advantages over the prior art for placement of components, in surface mounted placement, as well as die and attach and tape and reel applications, it will be understood, however, that various changes in the details, materials and arrangements of parts which have been herein described and illustrated in order to explain the nature of the invention may be made by those skilled in the art within the principle and scope of the invention as expressed in the appended claims.

What is claimed is:

1. An actuating nozzle comprising:

a housing;

a nozzle slidably supported by said housing;

a first magnetic portion coupled to said stem; and, a second magnetic portion coupled to said housing, said second magnetic portion being oriented to exert a magnetic force on said first magnetic portion.

2. The actuator of claim 1, wherein said second magnetic portion is oriented to exert a repulsive force on said first magnetic portion.

3. The actuator of claim 1, wherein said second magnetic portion is oriented to exert an attractive force on said first magnetic portion.

4. The actuator of claim 1, wherein:

said stem has a rest position in said housing; and, said first and second magnetic portions are oriented to resist displacement of said stem from said rest position.

5. A magnetic actuator comprising:

a housing having a first opening;

a stem having a first end containing a first aperture and extending through said first opening and a longitudinal bore extending from said first aperture forming a nozzle, and said stem being slidably supported by said housing and having a rest position relative to said housing;

a first magnetic portion coupled to said stem; and, a second magnetic portion coupled to said housing, said second magnetic portion being oriented to exert a magnetic force on said first magnetic portion to resist displacement of said stem from said rest position.

6. A magnetic actuator comprising:
a housing having a first opening, a second opening and a bore through said housing connecting said first and said second openings;
a stem having a first end containing a first aperture and extending through said first opening, a second end containing a second aperture and extending through said second opening and a longitudinal bore providing fluid communication between said first and second apertures forming a nozzle, and said stem being slidably disposed in said bore and having a rest position relative to said housing;
a first magnetic portion coupled to said stem; and,
a second magnetic portion coupled to said housing, said second magnetic portion being oriented to exert a magnetic force on said first magnetic portion to resist displacement of said stem from said rest position.

7. The actuator of claim 6, wherein:
said stem includes a longitudinal axis and has a noncircular cross section perpendicular to said axis;
said housing further comprises an inner surface that conforms to said cross section of said stem to prevent said stem from rotating about said axis.

8. A magnetic bondhead comprising:
a housing having a first opening;
a nozzle having a first end extending through said first opening and containing a first aperture, a second end containing a second aperture, and a longitudinal bore providing fluid communication between said first and said second apertures, said nozzle being slidably disposed within said housing and having a rest position in said housing;
a first magnetic portion coupled to said nozzle;
a second magnetic portion coupled to said housing, said second magnetic portion being oriented to exert a magnetic force on said first magnetic portion to resist displacement of said stem from said rest position; and,
a suction source in fluid communication with said second aperture.

9. The apparatus of claim 8, wherein said second magnetic portion is oriented to exert a repulsive force on said first magnetic portion.

10. The apparatus of claim 8, wherein said second magnetic portion is oriented to exert an attractive force on said first magnetic portion.

11. The actuator of claim 8, further comprising:
a theta guide attached to said housing;
a stem guide attached to said housing;
a stem holder attached to said stem and including a guide bore adapted to slidably receive said stem guide, wherein said first magnetic portion is disposed in said stem holder;
a theta shaft extending from said stem holder in a direction away from said stem, and,
a theta bearing mounted on said theta shaft, said first magnetic portion and said second magnetic portion being aligned to bias said theta bearing against said theta guide.

12. The actuator of claim 8, wherein said first magnetic portion is integral with said stem.

13. The actuator of claim 8, wherein:
said stem further includes a longitudinal axis and has a noncircular cross section perpendicular to said axis, and said housing further comprises an inner surface that conforms to said cross section of said stem to prevent said stem from rotating about said axis.

14. An apparatus for picking and placing objects, comprising:
a pick and place machine including a magnetic bondhead comprising:
a housing having a first opening;
a nozzle having a first end extending through said first opening and containing a first aperture, a second end containing a second aperture, and a longitudinal bore providing fluid communication between said first and said second apertures, said nozzle being slidably disposed within said housing and having a rest position in said housing;
a first magnetic portion coupled to said nozzle;
a second magnetic portion coupled to said housing, said second magnetic portion being oriented to exert an attractive force on said first magnetic portion and to resist displacement of said stem from said rest position; and,
a suction source in fluid communication with said second aperture.

15. An apparatus for preventing rotation about an axis of a rotatable stem disposed in a housing, said apparatus comprising:
a theta guide attachable to the stem and coupled to a first magnetic portion;
a stem guide attachable to the housing, said stem guide being biasable against said theta guide to prevent rotation of the stem about the axis, and said stem guide including a second magnetic portion oriented with respect to said first magnetic portion to bias said theta guide against said stem guide.

16. An actuator comprising:
a housing containing a bore and including a stem guide and a second magnetic portion;
a stem slidably disposed in said bore, said stem including a theta guide and a first magnetic portion, and said second magnetic portion being oriented with respect to said first magnetic portion to bias said theta guide against said stem guide to prevent rotation of said stem within said bore.

17. A method of actuating a nozzle, comprising:
providing a first magnetic portion coupled to a nozzle slidably disposed in a housing;
providing a second magnetic portion coupled to the housing; and,
orienting the first and second magnetic portions to slidably displace the nozzle in the housing.

18. The method of claim 17 wherein said orienting further comprises orienting the second magnetic portion to exert a repulsive force on the first magnetic portion.

19. The method of claim 17 wherein said orienting further comprises orienting the second magnetic portion to exert an attractive force on the first magnetic portion.

20. A method of limiting the force applied to a nozzle in a rest position, said method comprising:
providing a first magnetic portion coupled to a nozzle slidably disposed in a housing at a rest position;
providing a second magnetic portion coupled to the housing; and,
orienting the second magnetic portion to exert a limited attractive magnetic force on the first magnetic portion to resist sliding displacement of the nozzle from the rest position in the housing in response to an applied force.

21. A method of picking a component using a nozzle, said method comprising:

provide a first magnetic portion coupled to a nozzle slidably disposed in a housing;

providing a second magnetic portion coupled to the housing;

orienting the second magnetic portion to exert a limited attractive force on the first magnetic portion to resist sliding displacement of the nozzle from a rest position in the housing in response to an applied force;

drawing a suction through the nozzle; and, applying a force to the component with the nozzle to retain the component against the nozzle via the suction drawn through the nozzle; and, picking up the component using the nozzle.

22. A method of restraining movement of a nozzle slidably disposed in a housing, said method comprising:

providing a first magnetic portion coupled to a nozzle slidably disposed in a housing;

providing a second magnetic portion coupled to the housing; and, orienting the second magnetic portion to exert an increasing repulsive magnetic force on the first magnetic portion as the nozzle is slidably displaced toward said second magnetic portion.

23. A method of preventing rotation of a stem in a housing, said method comprising:

providing a stem slidably disposed in a housing along a stem axis, the stem having a theta guide extending from the stem and a first magnetic portion;

providing the housing with a stem guide and a second magnetic portion coupled to the housing, said stem guide being biasable against the theta guide to prevent rotation of the stem around the stem axis; and, orienting the first and second magnetic portions to exert a magnetic force to bias the theta guide against the stem guide.

24. A magnetic actuator comprising:

a housing having a first opening, a second opening and a bore through said housing connecting said first and said second openings;

a stem having a first end extending through said first opening and a second end extending through said second opening, and said stem being slidably disposed in said bore and having a rest position relative to said housing;

a first magnetic portion integral to said stem; and, a second magnetic portion coupled to said housing, said second magnetic portion being oriented to exert a magnetic force on said first magnetic portion to resist displacement of said stem from said rest position.

* * * * *

UNITED STATES PATENT AND TRADEMARK OFFICE
CERTIFICATE OF CORRECTION

PATENT NO. : 5,831,504  
DATED : November 3, 1998  
INVENTOR(S) : Piper et al.

Page 1 of 1

It is certified that error appears in the above-identified patent and that said Letters Patent is hereby corrected as shown below:

Column 6,
Line 14, delete "stem" and insert therefor -- nozzle --.
Line 53, delete "stem" and insert therefor -- nozzle --.
Line 55, delete "stem" and insert therefor -- nozzle --.

Signed and Sealed this

Twenty-first Day of August, 2001

Attest:

*Attesting Officer*

NICHOLAS P. GODICI
*Acting Director of the United States Patent and Trademark Office*